United States Patent
Payne et al.

(10) Patent No.: US 9,031,700 B2
(45) Date of Patent: May 12, 2015

(54) FACILITIES MANIFOLD WITH PROXIMITY SENSOR

(75) Inventors: Makonnen Payne, Mount Vernon, NY (US); Rekha Rajaram, White Plains, NY (US)

(73) Assignee: Intermolecular, Inc., San Jose, CA (US)

(\*) Notice: Subject to any disclaimer, the term of this patent is extended or adjusted under 35 U.S.C. 154(b) by 247 days.

(21) Appl. No.: 13/270,341

(22) Filed: Oct. 11, 2011

(65) Prior Publication Data

US 2013/0090765 A1    Apr. 11, 2013

(51) Int. Cl.
*G01B 13/02* (2006.01)
*H01L 21/67* (2006.01)
*G05B 19/418* (2006.01)

(52) U.S. Cl.
CPC ...... *H01L 21/67294* (2013.01); *G05B 19/4183* (2013.01); *G05B 2219/31095* (2013.01); *G05B 2219/31304* (2013.01); *G05B 2219/45031* (2013.01)

(58) Field of Classification Search
CPC .............. G05B 19/4183; G05B 2219/31095; G05B 2219/45031; G05B 2219/31304; H01L 21/67294
USPC .............. 700/266, 268; 702/31, 32, 19, 22; 422/105, 107, 601–603; 506/43, 33–41
See application file for complete search history.

(56) References Cited

U.S. PATENT DOCUMENTS

| | | | |
|---|---|---|---|
| 4,325,518 A | 4/1982 | Karr et al. | |
| 5,112,469 A | 5/1992 | Kempf et al. | |
| 5,222,719 A | 6/1993 | Effner | |
| 5,640,002 A | 6/1997 | Ruppert et al. | |
| 6,161,311 A | 12/2000 | Doley et al. | |
| 6,343,784 B1 | 2/2002 | Jourde et al. | |
| 6,439,559 B1 | 8/2002 | Kinnard et al. | |
| 6,450,755 B1 | 9/2002 | Cameron et al. | |
| 6,935,932 B2 | 8/2005 | Kimura et al. | |
| 7,108,589 B2 | 9/2006 | Kimura et al. | |
| 7,465,558 B2 | 12/2008 | Vasylyev et al. | |
| 2002/0008345 A1 | 1/2002 | Van Der Toorn | |
| 2010/0163497 A1* | 7/2010 | Bauder et al. | 210/758 |
| 2010/0255195 A1 | 10/2010 | Lambert et al. | |

\* cited by examiner

*Primary Examiner* — Shogo Sasaki

(57) ABSTRACT

A high productivity combinatorial system can be configured with sensors to automatically sense an identification tag of an installed reactor assembly, which comprises corresponding sensing elements. Configuration and usage data of the install reactor assembly can be retrieved from the identification tag, allowing the combinatorial system to properly access the reactor regions in the reactor assembly.

13 Claims, 10 Drawing Sheets

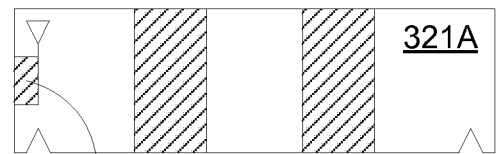
325A
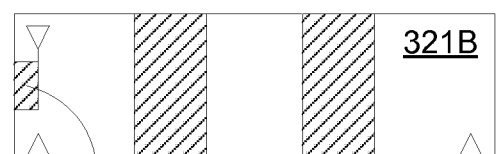
325B
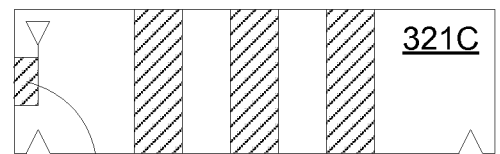
325C
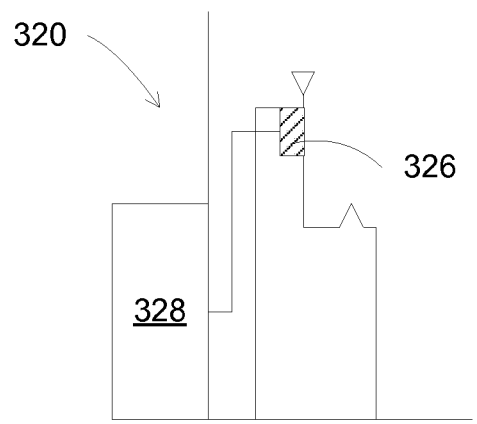
Fig. 3

Coupling a different non-contact identification tag on each of a plurality of reactor assemblies of a combinatorial processing system
790

Storing configuration data or usage permission data of the plurality of the reactor assemblies in configuration data base or usage data base based on the identification tag
791

Fig. 7

Installing a non-contact sensor for reading an identification tag on an installed reactor assembly
800

Coupling an output of the sensor to a controller of a combinatorial processing system for automatic configuring the system to accept the installed reactor assembly
801

Fig. 8

FACILITIES MANIFOLD WITH PROXIMITY SENSOR

FIELD OF THE INVENTION

The present invention relates generally to automatic configuring processing systems, and particularly to automatic configuring high productivity combinatorial systems to accept an interchangeable component.

BACKGROUND OF THE INVENTION

The manufacture of semiconductor devices entails the integration and sequencing of many unit processing steps. As an example, integrated circuits are fabricated on semiconductor wafers, and typically include a series of processing steps such as cleaning, surface preparation, deposition, lithography, patterning, etching, planarization, implantation, and thermal annealing. The precise sequencing and integration of the unit processing steps enables the formation of functional devices meeting desired performance metrics such as speed, power consumption, and reliability.

Each processing step is typically performed in a process chamber which can be coupled to a wafer transfer station comprising a transfer robot for transferring the wafers in and out of the process chamber. In a cluster tool, a transfer station can service multiple process chambers. The process chambers are interchangeable, meaning different process chambers can be coupled to a same transfer station. Thus, after a process chamber is mechanically coupled to the transfer station, the configuration of the transfer station is manually updated to include the capability of the process chamber, such as the number of process gases and their maximum flow rates.

For example, configuration data of a process chamber are programmed to the transfer robot so that the robot can access the process chamber. The configuration data can include the location of the process chamber door, so that the robot can enter the process chamber for picking or placing a wafer. The configuration data can include the location of the process chamber substrate support, so that the robot can pick or place a wafer with adequate precision.

Usage permission data can also be programmed to the transfer robot. For example, when a process chamber is removed from the transfer station, it is no longer available for processing, and permission is denied when a user attempts to use such a process chamber.

In a typical programming session, a technician calibrates the transfer robot for wafer handling by visual inspection. Configuration data for each process chamber is programmed to the transfer robot before the system is ready for processing. When a new process chamber is installed, the calibration process is repeated, with new configuration data entered. The practice is time consuming, and prone to errors and precision loss.

What is needed is an automatic configuration for processing system having multiple interchangeable components.

SUMMARY OF THE DESCRIPTION

The present invention relates to systems and method to automatic configure a system to interface with an installed interchangeable mechanical component, potentially preventing damage to either the system or to the component due to improper configuration. The present invention can also allow setting usage permission to avoid unauthorized or improper usage of certain interchangeable mechanical components. The present invention can also allow tracking usage of the interchangeable mechanical components, obtaining information about the lifetime and replacement cycles.

In some embodiments, the present invention discloses high productivity combinatorial (HPC) systems and methods to operate a HPC system having an installed interchangeable reactor assembly. A plurality of interchangeable reactor assemblies can be used in a HPC system, each with different configuration or usage permission. For example, a reactor assembly can have 32 reactors disposed in a 4 by 8 configuration in a reactor assembly, while another reactor assembly having 64 reactors disposed in an 8 by 8 configuration. Further, a reactor assembly can be marked for acid usage, while another reactor assembly marked for solvent usage.

In some embodiments, the present invention discloses systems and methods to operate a system having a plurality of interchangeable reactor assemblies wherein the system can be automatically configured to interface with an installed reactor assembly. After a reactor assembly is installed within the system, an identification tag of the reactor assembly is sensed without being physically touched or contact. The non-contact sensing can provide flexibility to the coupling between the system and the reactor assembly, for example, permitting movements of the reactor assembly within the system, or permitting corrosive wet processing of the reactor assembly. Using the identification tag, the system is then configured to accept the installed reactor assembly. For example, the system can retrieve and store configuration data of the installed reactor assembly, allowing the integration of the system with the installed reactor assembly, such as allowing a system robot mechanism to properly access the installed reactor assembly. The system can also retrieve and store the usage permission data for the installed reactor assembly, allowing the system to use the installed reactor assembly only for permitted purposes or to prevent using the installed reactor assembly for conflicting purposes.

The reactor assembly can comprise one or more proximity sensing elements disposed at different locations to allow distinguishing between different reactor assemblies. The proximity sensing elements can form an identification tag to uniquely identify the different reactor assemblies. The configuration data and usage permission data for the reactor assembly can be retrieved from a database using the identification tag. Alternatively, the reactor assembly can comprise an RFID tag, returning an identification tag in response to an inquiry from the system. The RFID can further include configuration data and usage permission data, allowing configuring the system to interface with the installed reactor assembly.

After installing a reactor assembly, the system non-contactly senses an identification tag of the installed reactor assembly to retrieve at least one of configuration data and usage permission data of the installed reactor assembly. The configuration data can allow configuring the HPC system to allow a system robot to access a plurality of reactors in the installed reactor assembly. For example, the system can identify the locations of the reactors with the configuration data, and can dispense chemicals to the reactors without errors. The system can also alert a user when a user input does not match with the retrieved configuration data. The usage permission data can allow using permitted chemicals in the reactors, for example, by alerting a user when the user attempts to use a chemical that is not permitted in the installed reactor assembly. The identification tag can also allow tracking usages of the reactor assemblies, obtaining information about the lifetime and replacement cycles.

In some embodiments, the present invention discloses systems and methods to configuring a system having a plurality of interchangeable reactor assemblies to allow automatic configuration of a system to interface with an installed reactor assembly. By coupling a different non-contact identification tag on each of the plurality of the reactor assemblies, the system can sense the identification tag, and can identify which one of the plurality of the reactor assemblies is currently installed in the system. After retrieving configuration data and/or usage permission data from the identification tag, the system can be configured to accept the installed reactor assembly.

The configuration data and the usage permission data can be included in the identification tag, and the system then can extract the required information from the identification tag. For example, the non-contact identification tag can be an RFID tag, having a memory element that stores the identification information, together with configuration and usage permission data. The configuration data and the usage permission data can be stored in configuration and usage databases which have been prepared by the system, linking identification information of the plurality of reactor assemblies to their configuration data and usage permission data.

In some embodiments, the present invention discloses installing non-contact sensor to read the identification tag on an installed reactor assembly, and coupling an output of the sensor to a system controller to allow configuring the system for the installed reactor assembly. The system controller can be configured to extract configuration data and usage permission data from the identification tag. Alternatively, the system controller can be coupled to configuration and usage databases linking the identification data with the configuration and usage permission data for the plurality of reactor assemblies. The system controller then can retrieve configuration data and usage permission data using the identification tag.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 3 illustrates an exemplary identification tag using radio-frequency identification according to some embodiments of the present invention.

FIG. 7 illustrates an exemplary flowchart for preparing reactor assemblies according to some embodiments of the present invention.

FIG. 8 illustrates an exemplary flowchart for preparing a processing system according to some embodiments of the present invention.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to interchangeable components in a system, and particular to the automatic configuration of an installed interchangeable component. In particular, the present invention relates to systems and methods for automatic configuring a HPC processing system to accept an installed interchangeable reactor assembly.

The drive towards ever increasing performance of devices has led to a dramatic increase in the complexity of process sequence integration and device integration. The precise material selection, process conditions, and process sequences must be properly optimized and integrated. As part of the qualification process, it is desirable to be able to test different materials, test different process conditions, test different sequencing and integration of processing modules or processing tools in the manufacture of devices such as integrated circuits.

Combinatorial processing has greatly improved both the speed of and reduced the costs associated with the development (including discovery, implementation, optimization, and qualification of materials, process conditions and process integration sequences for manufacturing requirements) of semiconductor materials. In particular, combinatorial process sequence integration has been able to offer the ability to test more than one material, more than one processing condition, more than one sequence of processing conditions, and more than one process sequence integration flow on a single monolithic substrate.

In an exemplary combinatorial process, multiple experiments can be performed in parallel in a high throughput manner. For example, multiple differentially processed regions are defined on a substrate in which the regions are processed differently, such as employing different materials or different process conditions. Once processed, the regions can be evaluated for useful properties such as electrical or structural properties.

Figure 1:
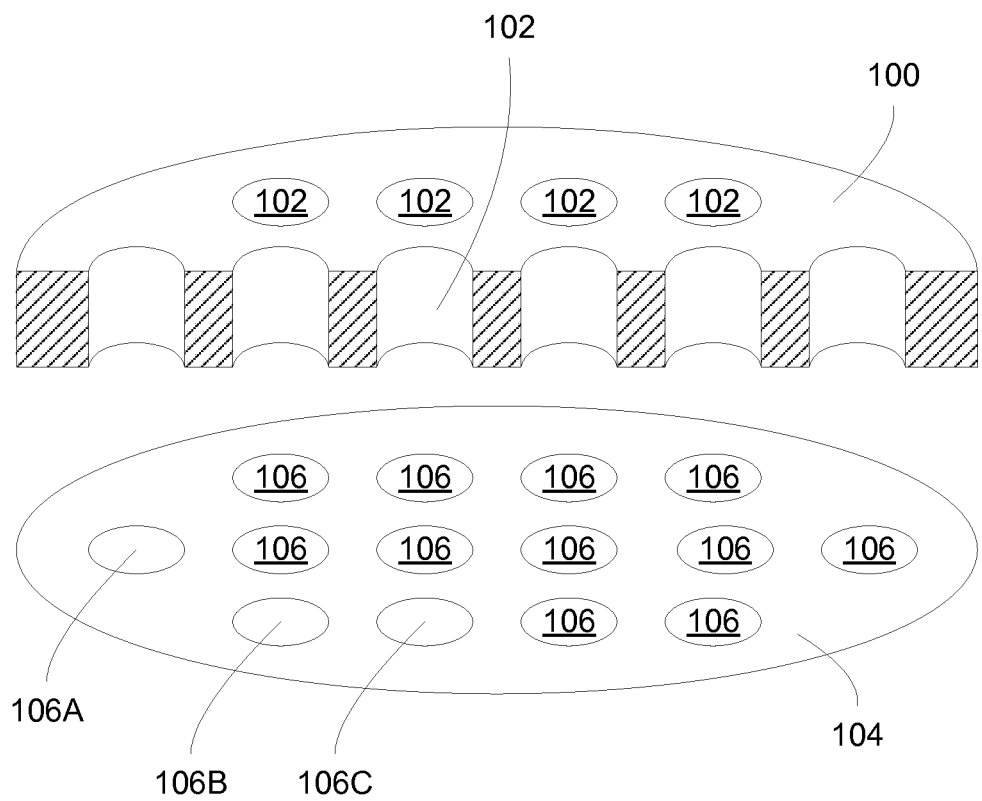
FIG. 1 illustrates an exemplary schematic of a combinatorial processing methodology according to some embodiments of the present invention.

FIG. 1 illustrates an exemplary schematic of a combinatorial processing methodology according to some embodiments of the present invention. A combinatorial processing tool may include a reactor assembly 100 having a plurality of reactors 102. The reactor assembly 100 is configured to mate with a substrate 104, and defined several regions 106 on which semiconductor processes can be performed.

As shown, the reactors 102 have a tubular configuration having an inner diameter consummate with the size of the region or portion of the region of the substrate that is to be isolated. The material used for the fabrication of the reactor assembly 100 is preferably chosen to be chemically inert and stable with respect to process chemistries and environments, such as Teflon or quartz.

For example, the regions 106A, 106B, and 106C may each have an electroless layer deposited on them. The region 106A may use a first chemical formulation, the region 106B may use a second chemical formulation, and the region 106C may use a third chemical formulation. The resulting layers can be compared to determine the relative efficacy of each of the formulations. None, one, or more of the formulations can then be selected to use with further combinatorial processing or larger scale processing (e.g., manufacturing). Any process variable (e.g., time, composition, temperature) or process sequencing can be varied using combinatorial processing.

Each of the regions 106 may be processed using a reactor 102 in a reactor assembly 100 installed in a combinatorial processing system. The combinatorial processing system is calibrated so that processing in each of the regions 106 is consistent and comparable. For example, pressure within the combinatorial processing system may be monitored and the pressure supplied to the chemical supply vessel or bottle can be adjusted so that the flow rate in the reactors stays consistent and calibrated. With these techniques, processed regions across one or multiple substrates may show reliable results that can be compared and characterized when performing combinatorial processing.

In some embodiments, a combinatorial processing system comprises different interchangeable reactor assemblies, which define different sets of processing regions on a substrate. The reactors in each reactor assembly can be arranged in particular patterns to define a desired set of processing regions, where the sizes of the reactors form the sizes of the processing regions, and the reactor locations in the reactor assembly forms the configuration of the processing regions on the substrate.

The interchangeable reactor assemblies are swappable, with a typical alignment mechanism to ensure proper installation. The reactor assemblies can be categorized by reactor configuration, for example, to permit screening or uniformity experiments, and by usage, for example, to avoid cross contamination.

Figure 2:
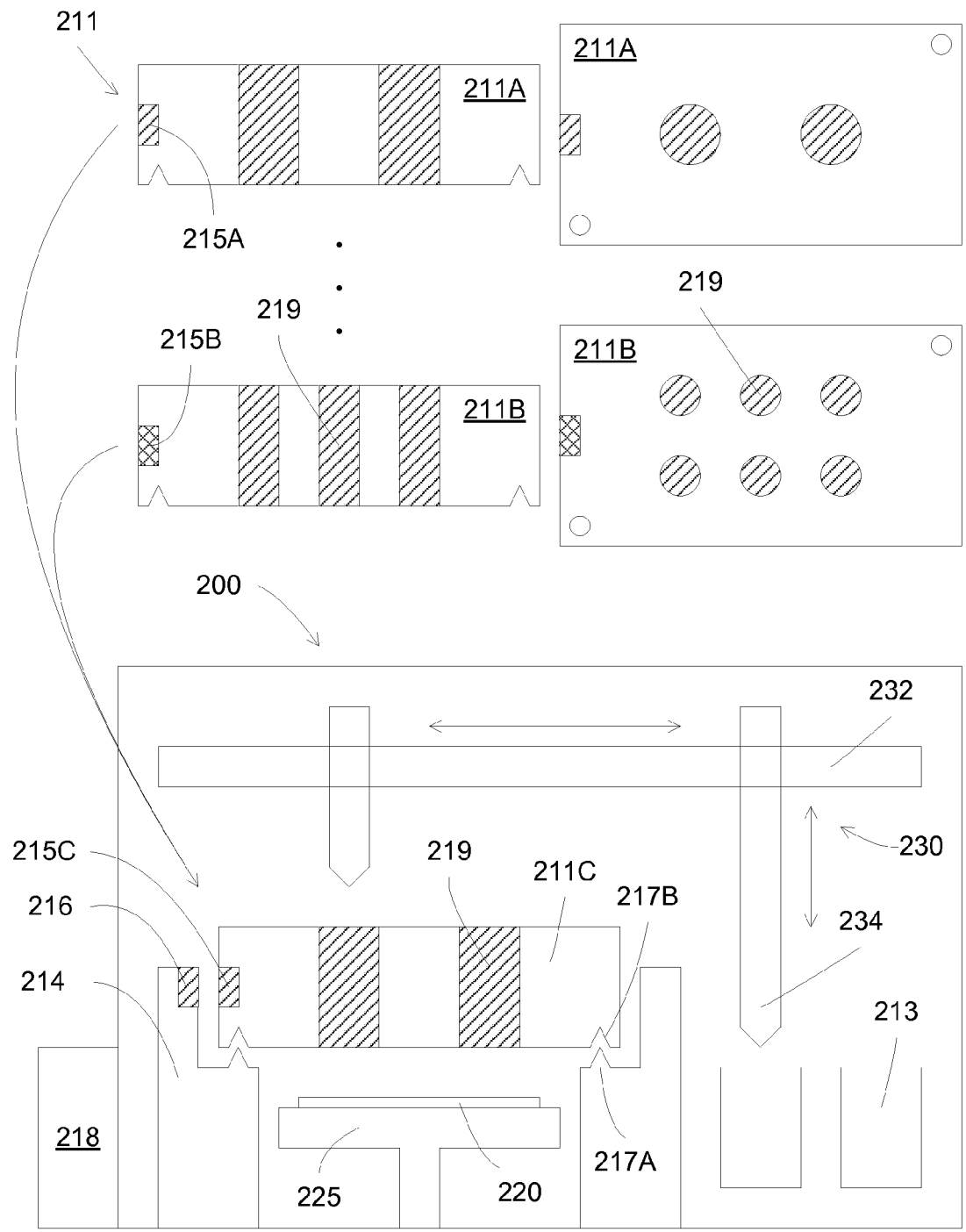
FIG. 2 illustrates a schematic diagram of a combinatorial processing system according to some embodiments of the present invention.

FIG. 2 illustrates a schematic diagram of a combinatorial processing system according to some embodiments of the present invention. The illustrated combinatorial processing system 200 may be a wet processing tool and may be a portion of a larger combinatorial processing system. For example, portions of the combinatorial processing system 200 may be replicated several times within a larger combinatorial processing tool such that a larger number of variations in substrate processing conditions may be achieved.

The combinatorial processing system 200 can be adapted to process each region 106 of the substrate 104 individually through the reactors in the reactor assembly 100. For example, the processing system can be adapted for the delivery of processing materials to the regions of the substrate, and be carried out using a partially or fully automated solution delivery system including a reactor assembly and its associated solution delivery system, robotics and electronics.

The combinatorial processing system 200 can comprise a mini-environment, such as a sealed environmental chamber or a vacuum chamber. Multiple reactor assemblies 211, such as reactor assemblies 211A and 211B, can be used interchangeably in the processing system 200, with each reactor comprising a plurality of reactors 219 (similar to reactors 102 shown in FIG. 1). The reactor assemblies 211 can have different numbers of reactors, different reactor sizes, and different reactor locations and arrangements.

In an exemplary process sequence, a reactor assembly 211C is selected based on process requirements, such as the number and size of the reactors, together with the material compatibility. For example, to perform an acid-related or a solvent-related process, an acid or a solvent reactor assembly is selected, respectively.

A selected reactor assembly 211C is then installed in the processing system 200. Various positioning and alignment techniques can be used to align and position the reactor assembly 211C to assembly support structure 214, such as the used of mated alignment pins 217A and 217B. The user then programs controller 218 to accept the installed reactor assembly 211C, for example, by selecting a reactor assembly configuration suitable for the installed reactor assembly.

A substrate 220 is disposed on a substrate support 225, for example, by a transfer robot carrying the substrate from a substrate container. The substrate support 225 moves upward to mate with the reactor assembly 211C. The substrate support can be motorized to enable automatic sequencing of moving the substrate vertically until a desired contact with the reactor assembly is established.

After bringing the substrate 220 into contact with the reactor assembly 211C to isolate regions of the substrate, the regions can be processed in a combinatorial manner. For example, a delivery system 230, such as an auto-delivery system and delivery methods, can be used to deliver processing materials, such as processing fluids to the isolated regions 106. In some embodiments, an auto-delivering system 230 can include a movable probe 234, typically mounted on a support arm, a translation station 232 for providing three-dimensional motion of the probe 234, and a controller 218, such as a computer, for controlling three-dimensional motions of the probe 234 between various spatial addresses. The auto-delivery system 230 can comprise a user-interface to allow for user programming of the controller 218 with respect to probe motion and manipulations. The auto-delivery system 230 can further include other components, such as a liquid pump for drawing or expelling liquids, and connection lines for fluid communication between the probe 234 and liquid reservoirs 213.

In an exemplary operation, the controller 218 can direct the auto-delivery system 230 to withdraw a processing fluid from a fluid container 213, and subsequently direct the probe 234 to the reactors 219 for delivering the fluid to the isolated regions 106 of the substrate 220 through the reactors 219. The operation of the controller is typically defined in a recipe, which comprises an automation sequence of process movements and conditions to allow repeatability of reliability.

Although various implementations described herein are with reference to the combinatorial processing tool 200, it should be understood that some implementations may use other types of combinatorial processing tool, such as a combinatorial processing tool with an open deck or any other type of combinatorial processing tool that uses stirring or an agitation mechanism to facilitate reactions.

In some embodiments, the present invention discloses systems and methods to automate the configuration of reactor assembly 211C after installation. The invention can reduce user input during operation of the combinatorial processing system, thus eliminate or significantly reduce the chance for input errors.

Human error is typically a large source of tool use inefficiency. For example, to interface with an exemplary combinatorial processing system, the user inputs parameters, which include the installed reactor configuration, into the control software. The required user interaction can represent a potential source of human errors, potentially causing damage the system. For example, the user can select or input incorrect tool configuration, which can result in the crashing of the robot into the reactor assembly or in the dispensing of chemistry outside the reactor. In addition, the user can select or input incorrect reactor usage. For example, the interchangeable reactors are segregated by owners and by chemical type, but are visually similar, leading to potential confusion. The use of the incorrect reactors can lead to contamination or safety problem, since mixing of chemical of different types can lead to violent interactions.

In some embodiments, the present invention discloses non-contact tagging the reactor assemblies to eliminate some of the user interaction, thus can reduce the errors due to improper inputs or installation. The system can sense the tag on the installed reactor assembly, and then automatically perform reactor configuration to accept the installed reactor assembly without user input.

In some embodiments, each reactor assembly possesses a unique identification tag 215A, 215B or 215C that allows the system to distinguish between the different reactor assemblies 11A, 11B, or 11C. The identification tag can comprise configuration data, such as reactor sizes and locations, which can enable the system to properly access the individual reactors, for example, to allow the delivery system to dispense chemicals to the correct locations. The identification tag can comprise usage permission data, such as the processing operations or steps that can be used in the reactors, or the chemicals that are permitted or prohibited in the reactors. The configuration data and the usage permission data can be embedded in the identification tag, or can be stored in databases to be retrieved using the identification tag. A corresponding sensor 216 is installed, for example, at the support structure 214, to read the identification tag, and to communicate with a system controller 218 to configure the processing system 200.

In some embodiment, the present invention discloses methods to operate a combinatorial processing system having a plurality of interchangeable reactor assemblies. An exemplary method comprises first non-contact sensing an identification tag of an installed interchangeable reactor assembly. By using information associated with the identification tag, the processing system is configured to accept the interchangeable reactor assembly. After accepting the installed reactor assembly, chemicals can be dispensed to the proper locations of the reactor assembly. In some embodiments, accepting the interchangeable reactor assembly comprises integrating the reactor assembly to the processing system, permitting the processing system to utilize the reactor assembly. For example, the processing system is configured to identify locations of one or more reactors in the installed interchangeable reactor assembly, such as storing and integrating physical dimensions of the reactor assembly with the system robot mechanism, so that the system robot mechanism can properly access the reactor assembly. Chemical usage of the reactor assembly can also be stored and integrated with the system controller, so that the system can only use the reactor assembly for permitted operations.

In some embodiments, the method further comprises retrieving at least one of configuration data from a configuration database using information associated with the identification tag, usage permission data from a usage database using information associated with the identification tag, configuration data from information associated with the identification tag, and usage permission data from information associated with the identification tag, wherein the configuration data allow configuring the processing system to identify locations of the one or more reactors in the interchangeable reactor assembly, and wherein the usage permission data allow using the installed interchangeable reactor assembly for permitted purposes, such as for dispensing approved chemicals and for prohibiting dispensing non-approved chemicals. The method can further comprises tracking usages of the installed interchangeable reactor assembly, alerting a user when a user input does not match with the configuration data, or alerting a user when a usage of the installed interchangeable reactor assembly does not match with the usage permission data.

In some embodiments, the interchangeable reactor assembly comprises an RFID element to transfer the information associated with the identification tag to the processing system. In other embodiments, each of the interchangeable reactor assemblies comprises one or more proximity sensing elements disposed at different locations to allow distinguishing between the interchangeable reactor assemblies. The proximity sensing elements can comprise at least one of a Hall effect sensor; a capacitive sensor; a Doppler effect sensor; an Eddy-current sensor; an inductive sensor; a magnetic sensor; an optical sensor; an infrared sensor; or a photocell sensor.

In some embodiments, the present invention discloses methods to configure a system having a plurality of interchangeable reactor assemblies. An exemplary method comprises first installing a non-contact sensor for reading an identification tag on interchangeable reactor assemblies, and then coupling an output of the sensor to a system controller for configuring the system to accept the interchangeable reactor assemblies. The method can further comprises coupling the system controller to a configuration database linking identification data and configuration data for the plurality of interchangeable reactor assemblies, or coupling the system controller to a usage database linking identification data and usage permission data for the plurality of interchangeable reactor assemblies. The method can also comprises retrieving at least one of configuration data or usage permission data using the identification tag, wherein the configuration data allow configuring the system to interface with the interchangeable reactor assembly, and wherein the usage permission data allow using the installed interchangeable reactor assembly for permitted purposes.

In some embodiments, the present invention discloses systems to allow automatic configuration of an installed interchangeable reactor assembly. An exemplary high productivity combinatory system comprises a mechanical port for accepting an interchangeable reactor assembly from a plurality of interchangeable reactor assemblies, a sensor for reading a non-contact identification tag on an installed interchangeable reactor assembly, a database coupled to information associated with the identification tag, and a controller coupled to the sensor for retrieving at least one of configuration data or usage permission data of the installed interchangeable reactor assembly from the database. In some embodiments, the sensor comprises one of an RFID reader to read an RFID tag on the installed interchangeable reactor assembly, and a proximity sensor comprising at least one of a Hall effect sensor; a capacitive sensor; a Doppler effect sensor; an Eddy-current sensor; an inductive sensor; a magnetic sensor; an optical sensor; an infrared sensor; or a photocell sensor to sense a corresponding sensing element on the installed interchangeable reactor assembly. Alternatively, the sensor can comprise an array of proximity sensors for sensing one or more sensing elements of the installed interchangeable reactor assembly, wherein the sensing elements are disposed at different positions for different interchangeable reactor assemblies, which convey identification information of the different interchangeable reactor assemblies.

In some embodiments, the system can further comprises a configuration database linking the identification tag and configuration data for the plurality of interchangeable reactor assemblies, or a usage database linking the identification tag and usage permission data for the plurality of interchangeable reactor assemblies. The configuration data can allow configuring the processing system to identify locations of the one or more reactors in the installed interchangeable reactor assembly. The usage permission data can allow using the installed interchangeable reactor assembly for dispensing approved chemicals.

FIG. 3 illustrates an exemplary identification tag using radio-frequency identification according to some embodiments of the present invention. A radio-frequency identification (RFID) tag can be attached or embedded on each reactor assembly, with the RFID tag programmed to contain a unique identification and/or configuration and usage permission data for the attached reactor assembly. A corresponding RFID reader can be installed on the combinatorial processing system.

With the RFID tag, each reactor assembly can be uniquely identified when installed for use on the tool, for example, through the RFID reader reading the RFID tag. The information transferred to the RFID reader can comprise an identification of the reactor assembly, configuration data, usage permission data, or any combination thereof.

The reactor assemblies 321A, 321B, and 321C all have an RFID tag 325A, 325B, and 325C, respectively. The RFID tags are disposed at a location easily accessible to an RFID reader 326 located in the processing system 320. The RFID reader 326 communicates the information to the system controller 328, allowing the controller to automatically sense configuration data and usage permission data from the installed reactor assembly. In some embodiments, the configuration data and usage permission data can be retrieved from the identification tag. For example, the RFID tag can comprise identification for the reactor assembly, together with configuration data and usage permission data. During communication with the RFID tag, the RFID reader can retrieve configuration data and usage permission data from the RFID tag. The RFID tag is preferably a passive tag, meaning not requiring a battery. The RFID is preferably embedded within the outer surface of the reactor assembly, allowing cleaning of the reactor assembly without damaging the tag.

Alternatively, the configuration data and usage permission data can be stored in databases and can be retrieved using the identification tag. For example, a configuration database and a usage database can be stored in the system controller, and after retrieving an identification from the RFID identification tag, the controller can use the identification to look up the databases for the configuration data and usage permission data for the installed reactor assembly.

In some embodiments, the configuration data allow the system to configure the interface, such as storing the locations and volumes of the reactors in the reactor assembly so that the fluid delivery system can properly dispense fluid. The identification tag also allows automatic configuration, alerting the system control software to the configuration of the installed reactor assembly. In addition, the identification tag can also allow for the software to compare the configuration of the installed reactor assembly to the needs of a user, and to alert the user of any resulting errors.

The RFID tags are preferably sealed from outside environment, for example, embedded within the surface of the reactor assemblies. The RFID tags can be categorized according to reactor configurations, for example, tags 325B and 325C represent reactor assemblies 321B and 321C, respectively, which have different number of reactors. The RFID tags can be categorized according to usage, such as chemical usage or ownership usage. For example, tags 325A and 325B represent reactor assemblies 321A and 321B, respectively, which have same reactor configuration, but can be classified differently.

In some embodiments, the identification tag can provide an automated way to track usage of the reactor assemblies, which would give information about the lifetime and necessary replacement cycle.

For example, RFID tags for reactor assemblies having similar configuration and usage are programmed differently, for example, each reactor assembly has a unique identification, regardless of configuration and usage. This capability can allow tracking usage of the reactor assemblies, allowing monitoring lifetime and replacement schedules. This capability can also allow tracking the performance of the reactor assemblies, for example, by tracing the quality of the process results back to a specific reactor. The tagging of individual reactor assemblies thus can allow an assessment of the reactor assemblies based on their process performance.

In some embodiments, some reactor assemblies have no identification tag. The system controller can ask for manual configuration and usage data.

In some embodiments, the present invention discloses a combinatorial processing system configured to have automatic configuration capability for an installed reactor assembly. The processing system comprises a mechanical port to accept a reactor assembly, an RFID reader to communicate with RFID tags, or a sensor to communicate with one or more sensing elements, and a system controller to retrieve configuration data and usage permission data, and to automatically configure the processing system to accept the installed reactor assembly.

In some embodiments, the present invention discloses reactor assemblies configured to allow automatic configuration after being installed. The reactor assemblies comprise an RFID tag or one or more sensing elements, preferably embedded on or within the surface. The RFID tag or the sensing elements is programmed to contain at least an identification of the reactor assembly. In some embodiments, the RFID tags also include configuration data, usage permission data, and any other information related to the reactor assemblies.

In some embodiments, the present invention discloses proximity sensors for the reactor assemblies to be used with a processing system. A sensing element can be coupled to the reactor assemblies, which can be read by a corresponding sensor coupled to the processing system and communicate with the system controller. The sensor and sensing element are preferably non-contact proximity sensor system, to prevent any interference with the operation of the reactor assemblies in the processing system, such as loose fitting or solvent cleaning. The sensor system can comprise a Hall Effect sensor, a capacitive sensor, a Doppler Effect sensor, an Eddy-current sensor, an inductive sensor, a magnetic sensor, an optical sensor, an infrared sensor, a photocell sensor, or any combination thereof.

Figure 4A:
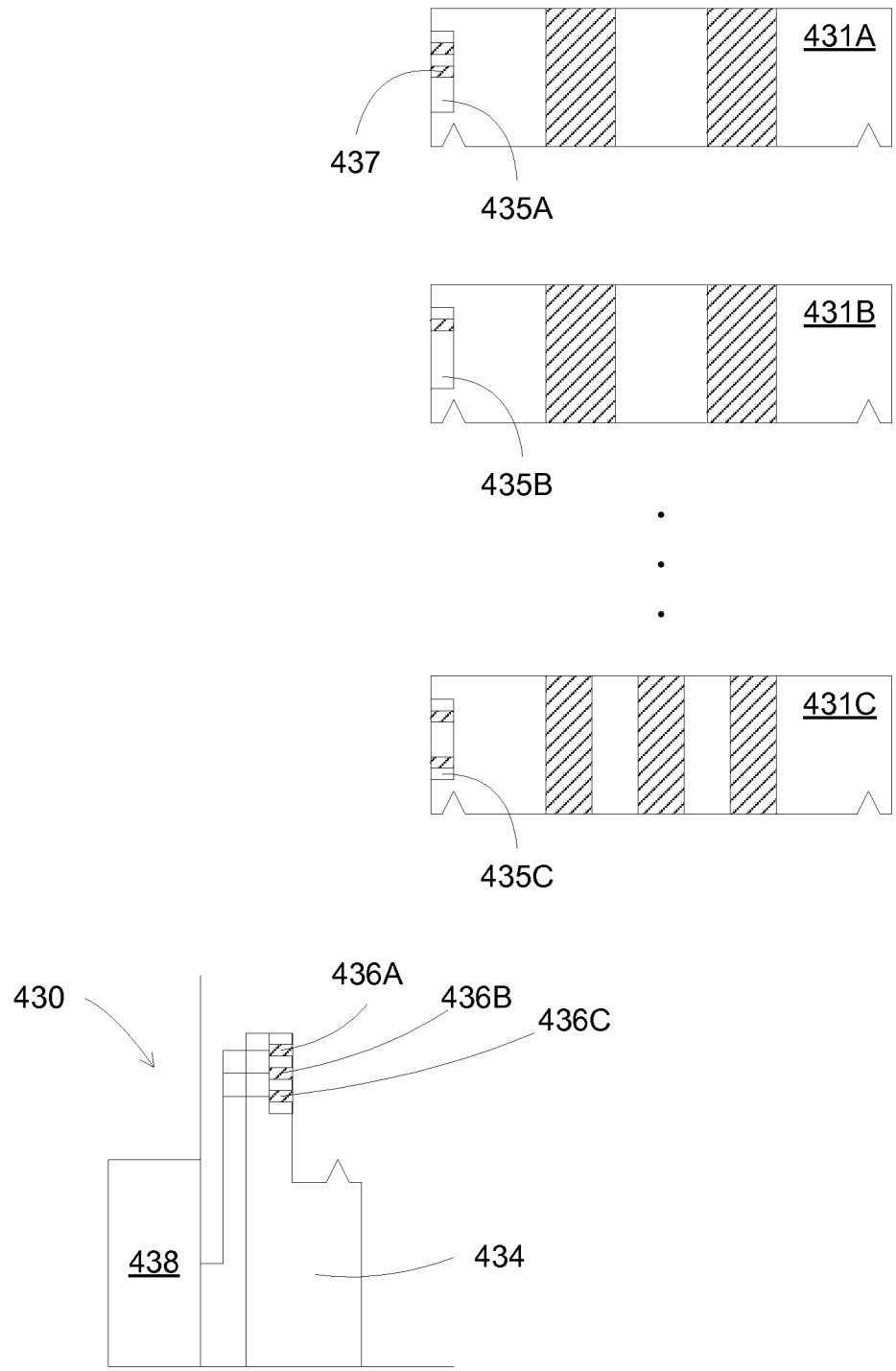
FIGS. 4A and 4B illustrate an exemplary proximity sensor system with surface configurations according to some embodiments of the present invention.
Figure 4B:
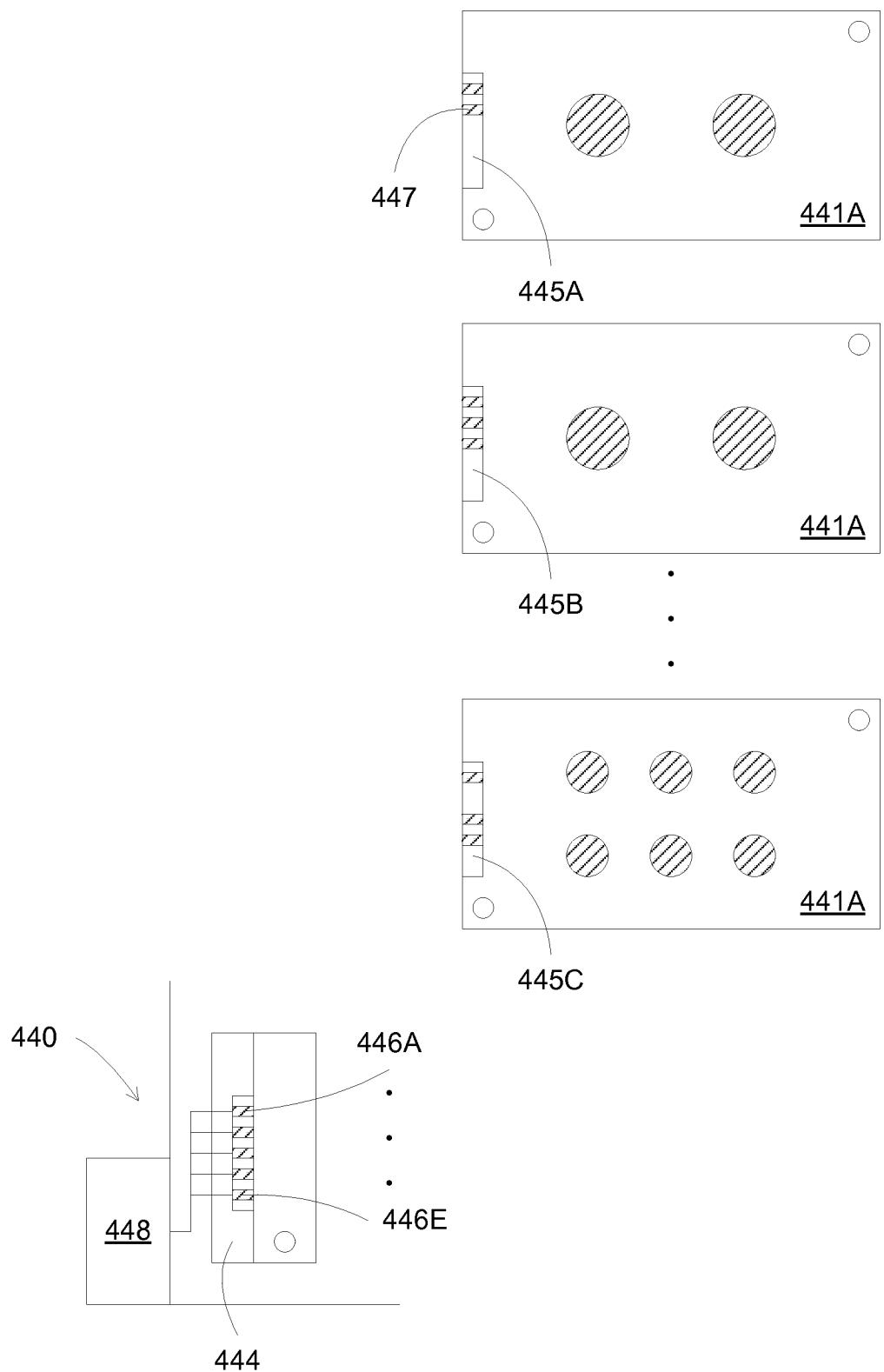

FIGS. 4A and 4B illustrate an exemplary proximity sensor system with surface configurations according to some embodiments of the present invention. In FIG. 4A, system 430 comprises a plurality of sensors 436A, 436B and 436C arranged vertically in a vicinity of the reactor assembly port 434. The sensors are preferably disposed to allow reading of sensing elements 35A, 435B, or 435C of the reactor assemblies in installed configuration, for example, located at a small distance away from the installed reactor assembly. The sensors 436A, 346B, and 436C communicate with system controller 438, providing the reading to the controller 438 for automatic configuration.

One or more sensing elements 437 are embedded in the reactor assemblies 431A, 431B, and 431C to form identification tags 435A, 435B and 435C, respectively. In this configuration, the sensing elements 437 provide a binary identification of the reactor assembly, depending on the locations of the sensing elements. For three sensor and sensing element system, the number of unique reactor assembly identification is $2^3=8$. More or less sensors and sensing elements can be used.

In FIG. 4B, system 440 comprises a plurality of sensors 446A-446E arranged horizontally in a vicinity of the reactor assembly port 444. The sensors are preferably disposed to allow reading of sensing elements 446A-446E. The sensors 446A-446E communicate with system controller 448, providing the reading to the controller 448 for automatic configuration.

One or more sensing elements 447 are embedded in the reactor assemblies 446A-446E to form identification tags 445A, 445B and 445C, respectively. In this configuration, five sensor and sensing element system, the number of unique reactor assembly identification is $2^5=32$.

The proximity sensor can contain limited information, which comprises the identification of the reactor assemblies. Configuration data and usage permission data can be stored in databases in the system controller, and can be retrieved using the identification data.

The proximity sensor system can comprise a magnetic sensor such as a Hall Effect sensor. Magnets 437 and 447 can be embedded in the reactor assemblies, which can be read by Hall Effect sensors 436A-436C and 446A-446E located in the processing system.

The proximity sensor system can comprise a capacitor sensor sensing a change in capacitance. Metal plates 437 and 447 can be embedded in the reactor assemblies, which can be read by capacitor sensors 436A-436C and 446A-446E located in the processing system.

The proximity sensor system can comprise an optical sensor sensing a returned beam. Metal plates 437 and 447 can be embedded in the reactor assemblies, which reflect an infrared light sending by sensors 436A-436C and 446A-446E located in the processing system.

Other types of sensor systems can also be used.

Figure 5:
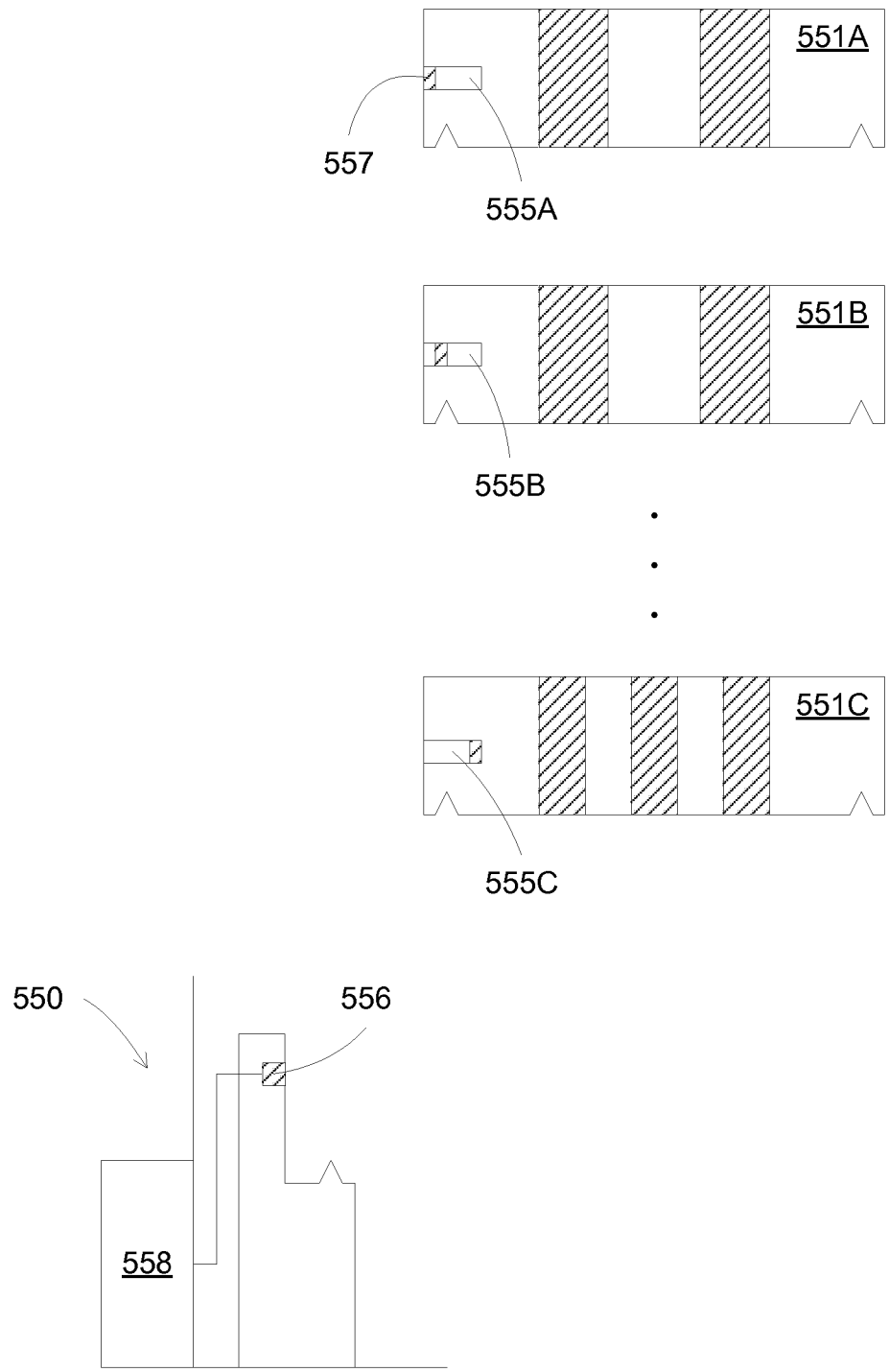
FIG. 5 illustrates an exemplary proximity sensor system with depth configurations according to some embodiments of the present invention.

FIG. 5 illustrates an exemplary proximity sensor system with depth configurations according to some embodiments of the present invention. System 550 comprises a sensor 556 in a vicinity of the reactor assembly port. The sensors are preferably disposed to allow reading of sensing elements 555A, 555B, or 555C of the reactor assemblies, and to communicate with system controller 558.

A sensing element 557 is embedded in the reactor assemblies 551A, 551B, and 551C to form identification tags 555A, 555B and 555C, respectively. In this configuration, the sensor 556 senses sensing element 557 at different distances, thus receiving a signal having strength depending on the depth of the sensing element 557.

Figure 6:
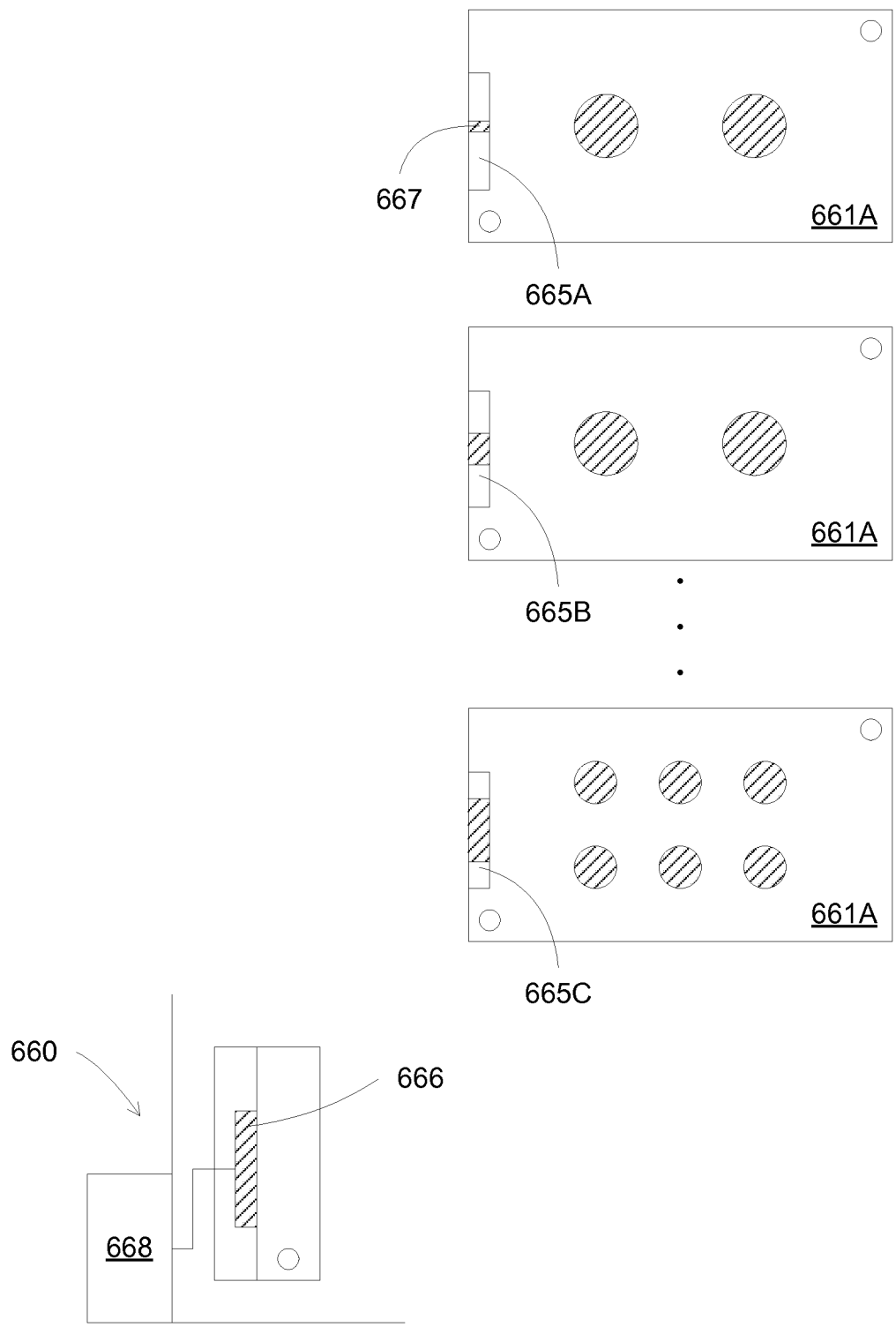
FIG. 6 illustrates an exemplary proximity sensor system with surface area configurations according to some embodiments of the present invention.

FIG. 6 illustrates an exemplary proximity sensor system with surface area configurations according to some embodiments of the present invention. System 660 comprises a sensor 666 in a vicinity of the reactor assembly port. The sensors are preferably disposed to allow reading of sensing elements 665A, 665B, or 665C of the reactor assemblies, and to communicate with system controller 68.

A sensing element 667 is embedded in the reactor assemblies 661A, 661B, and 661C to form identification tags 665A, 665B and 665C, respectively. Different sensing elements 667 have different surface areas, allowing sensor 666 to sense sensing element 667 at different signal strength, establishing unique identification for the reactor assemblies.

In some embodiments, the present invention discloses methods to prepare and operate a processing system, such as a combinatorial processing system having a plurality of interchangeable reactor assemblies. By installing different non-contact identification tags to each of the reactor assemblies, together with installing a corresponding sensor to the processing system, automatic configuration can be achieved.

FIG. 7 illustrates an exemplary flowchart for preparing reactor assemblies according to some embodiments of the present invention. In operation 790, different non-contact identification tags are coupled to each reactor assembly. The identification tag can be an RFID tag, or can comprise one or more sensing elements arranged in unique configuration to provide unique identification to a system sensor. In operation 791, configuration data and/or usage permission data for each reactor assembly are stored in databases, searchable by the identification data. For RFID tags, the configuration data and usage permission data can be stored in the RFID tag.

In some embodiments, the present invention discloses methods to configure a system having a plurality of interchangeable reactor assemblies, especially for the interchangeable reactor assemblies. An exemplary method comprises coupling a different non-contact identification tag on each of the plurality of the interchangeable reactor assemblies, and storing at least one of configuration data or usage permission data of the plurality of the interchangeable reactor assemblies in a database, and linking information associated with the identification tags with the at least one of configuration data or usage permission data. The identification tag of an installed interchangeable reactor assembly can provide identification information to the system for configuring the system to accept the installed interchangeable reactor assembly, for example, by configuring the processing system to identify locations of the one or more reactors in the interchangeable reactor assemblies, and by using the interchangeable reactor assemblies for dispensing approved chemicals. In some embodiments, coupling a non-contact identification tag on an interchangeable reactor assembly comprises coupling proximity sensing elements to different locations on the interchangeable reactor assembly.

The method can further comprises preparing a configuration database linking identification data and configuration data for the plurality of interchangeable reactor assemblies, or preparing a usage database linking identification data and usage permission data for the plurality of interchangeable reactor assemblies.

In some embodiments, the identification tag comprises an RFID tag, and the method further comprises storing in the identification tag at least one of configuration data of the interchangeable reactor assembly to allow configuring the system for interfacing a system controller with the installed interchangeable reactor assembly, or usage permission data of the interchangeable reactor assembly to allow using the installed interchangeable reactor assembly for permitted purposes.

In some embodiments, the present invention discloses interchangeable reactor assemblies to be used in a system that permits automatic configuration of an installed reactor assembly. An exemplary interchangeable reactor assembly comprises a non-contact identification tag comprising identification information of the interchangeable reactor assembly, wherein the identification tag provides identification information to the system when the interchangeable reactor assembly is installed in the system for configuring the system to accept the interchangeable reactor assembly. The non-contact identification tag can comprise an RFID tag; a Hall effect sensing element; a capacitive sensing element; a Doppler effect sensing element; an Eddy-current sensing element; an inductive sensing element; a magnetic sensing element; an optical sensing element; an infrared sensing element; and a photocell sensing element. Alternatively, the non-contact identification tag can comprise a proximity sensing element disposed at different positions for different interchangeable reactor assemblies, thereby containing identification information of the interchangeable reactor assembly.

FIG. 8 illustrates an exemplary flowchart for preparing a processing system according to some embodiments of the present invention. In operation 800, a non-contact sensor is installed for reading an identification tag on an installed reactor assembly. The sensor is preferably disposed in a vicinity of the installed reactor assembly, for example, at the station that houses the reactor assembly. In operation 801, an output of the sensor is coupled to a controller of a combinatorial processing system for automatic configuring the system to accept the installed reactor assembly.

Figure 9:
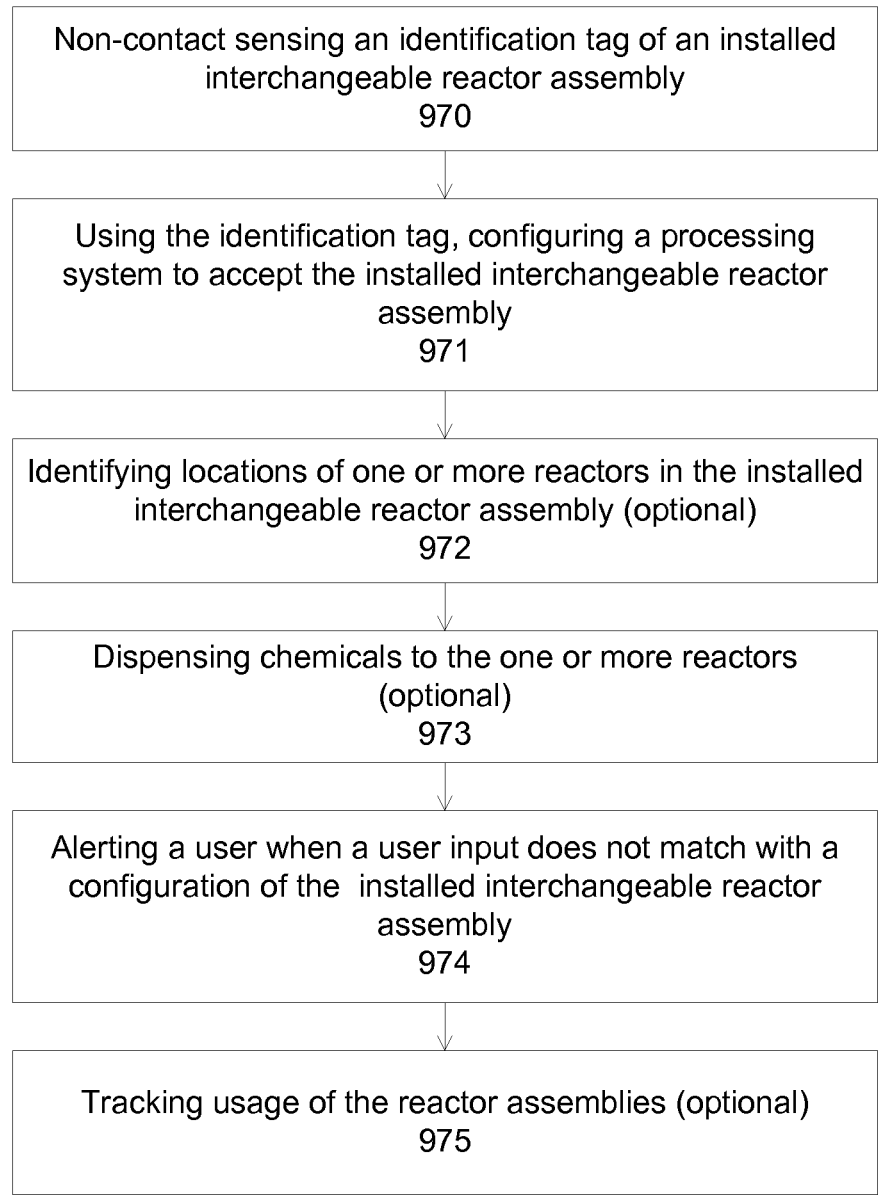
FIG. 9 illustrates an exemplary flowchart for operating a processing system according to some embodiments of the present invention.

FIG. 9 illustrates an exemplary flowchart for operating a processing system according to some embodiments of the present invention. In operation 970, an identification tag of an installed interchangeable reactor assembly is non-contactly sensed. In operation 971, the processing system is configured to accept the installed interchangeable reactor assembly using the sensed identification tag. For example, configuration data and/or usage data can be retrieved from databases using the identification tag. The configuration data can allow identifying locations of one or more reactors in the installed interchangeable reactor assembly (optional operation 972), and allow dispensing chemicals to the one or more reactors (optional operation 973). In operation 974, an alert signal is sent when a user input does not match with a configuration of the installed reactor assembly. In operation 975, usage of the reactor assemblies are tracked and stored (optional).

Figure 10A:
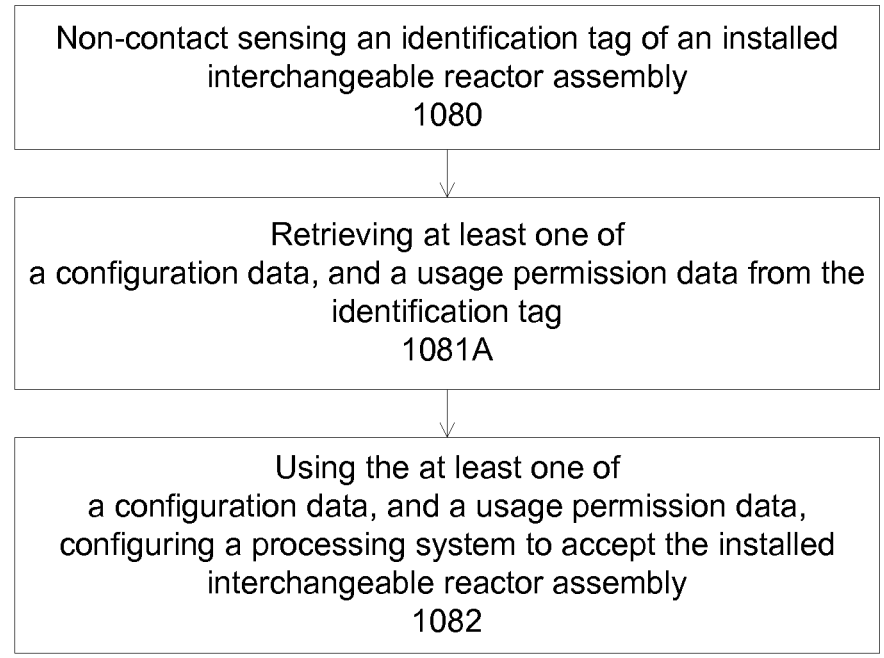
FIGS. 10A and 10B illustrate exemplary flowcharts for preparing reactor assemblies according to some embodiments of the present invention.

FIG. 10A illustrates an exemplary flowchart for preparing reactor assemblies according to some embodiments of the present invention. In operation 1080, a non-contact identification tag of an installed interchangeable reactor assembly is sensed. In operation 1081A, a system controller retrieves at least one of a configuration data from a configuration database, and a usage permission data from a usage database from the identification tag. In this configuration, the identification tag, such as an RFID tag, comprises the configuration and usage data, and thus the controller can retrieve this information from the identification tag. In operation 1082, the system controller uses the at least one of a configuration data, and a usage permission data, configuring a processing system to accept the installed interchangeable reactor assembly.

Figure 10B:
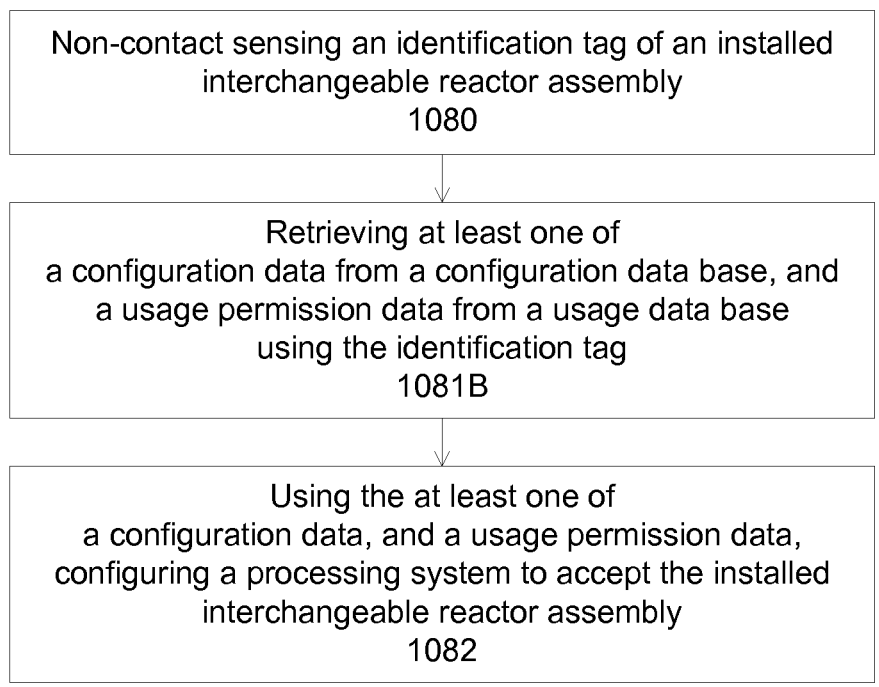

FIG. 10B illustrates another exemplary flowchart for preparing reactor assemblies according to some embodiments of the present invention. In operation 1081B, a system controller retrieves at least one of a configuration data from a configuration database, and a usage permission data from a usage database using the identification tag. In this configuration, the identification tag contains only identification data, and thus the controller can retrieve this information using the identification tag, for example, by searching databases with the identification data as search string.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method to configure a combinatorial processing system having a plurality of interchangeable reactor assemblies, wherein the combinatorial processing system is configured to have one of the plurality of interchangeable reactor assemblies installed, wherein each of the plurality of interchangeable reactor assemblies comprises multiple reactors, the method comprising
coupling different non-contact identification tags on each of the plurality of interchangeable reactor assemblies;
storing at least one of configuration data or usage permission data of the plurality of the interchangeable reactor assemblies in a database;
linking information associated with the identification tags with the at least one of configuration data or usage permission data,
wherein the configuration data allow configuring the combinatorial processing system to identify locations of the multiple reactors in the interchangeable reactor assemblies,
wherein the locations of the multiple reactors in a first interchangeable reactor assembly of the interchangeable reactor assemblies, relative to the combinatorial processing system when the first interchangeable reactor is installed in the combinatorial processing system, are different than the locations of the multiple reactors in a second interchangeable reactor assembly of the interchangeable reactor assemblies, relative to the combinatorial processing system when the second interchangeable reactor is installed in the combinatorial processing system at the same location as the first interchangeable reactor assembly, and
wherein the usage permission data allow using the interchangeable reactor assemblies for dispensing approved chemicals; and dispensing the approved chemicals to the multiple reactors.

2. A method as in claim 1 wherein the step of coupling different non-contact identification tags on each of the plurality of interchangeable reactor assemblies comprises coupling RFID tags on the interchangeable reactor assemblies.

3. A high productivity combinatory system comprising
a plurality of interchangeable reactor assemblies, wherein the combinatorial processing system is configured to have one of the plurality of interchangeable reactor assemblies installed, wherein each of the interchangeable reactor assemblies comprises multiple reactors located at locations in the each interchangeable reactor assembly, wherein the locations of the multiple reactors in a first interchangeable reactor assembly of the interchangeable reactor assemblies, relative to the combinatorial processing system when the first interchangeable reactor is installed in the combinatorial processing system, are different than the locations of the multiple reactors in a second interchangeable reactor assembly of the interchangeable reactor assemblies, relative to the combinatorial processing system when the second interchangeable reactor is installed in the combinatorial processing system at the same location as the first interchangeable reactor assembly, wherein each interchangeable reactor assembly comprises a non-contact identification tag;
a system body comprising a mechanical port, wherein the mechanical port is configured for accepting an interchangeable reactor assembly from the plurality of interchangeable reactor assemblies;

a sensor coupled to the system body, wherein the sensor is configured for reading the non-contact identification tag on an installed interchangeable reactor assembly;

a database coupled to information associated with the identification tag;

a controller coupled to the sensor for retrieving at least one of configuration data or usage permission data of the installed interchangeable reactor assembly from the database, wherein the configuration data allow configuring the high productivity combinatory system to identify locations of the multiple reactors in the installed interchangeable reactor assembly, and wherein the usage permission data allow using the installed interchangeable reactor assembly for dispensing approved chemicals.

4. A system as in claim 3 wherein the sensor comprises one of an RFID reader to read an RFID tag on the installed interchangeable reactor assembly, and a proximity sensor comprising at least one of a Hall effect sensor; a capacitive sensor; a Doppler effect sensor; an Eddy-current sensor; an inductive sensor; a magnetic sensor; an optical sensor; an infrared sensor; or a photocell sensor to sense a corresponding sensing element on the installed interchangeable reactor assembly.

5. A method as in claim 1 wherein each of the multiple reactors in the first interchangeable reactor assembly has a volume different than each of the multiple reactors in the second interchangeable reactor assembly, wherein the method further comprises identifying the volumes of the multiple reactors in the installed interchangeable reactor assembly;

configuring the processing system to recognize the volumes of the multiple reactors in the installed interchangeable reactor assembly.

6. A method as in claim 1 wherein at least one of the multiple reactors in the first interchangeable reactor assembly has a volume different than at least one of the multiple reactors in the second interchangeable reactor assembly, wherein the method further comprises identifying the volumes of the multiple reactors in the installed interchangeable reactor assembly;

configuring the processing system to recognize the volumes of the multiple reactors in the installed interchangeable reactor assembly.

7. A system as in claim 3 wherein each of the multiple reactors in the first interchangeable reactor assembly has a volume different than each of the multiple reactors in the second interchangeable reactor assembly.

8. A system as in claim 3 wherein at least one of the multiple reactors in the first interchangeable reactor assembly has a volume different than at least one of the multiple reactors in the second interchangeable reactor assembly.

9. A method as in claim 1, wherein the identification tag of the installed interchangeable reactor assembly comprises an RFID element to transfer the information associated with the identification tag to the combinatorial processing system.

10. A method as in claim 1, further comprising retrieving configuration data either from the database using the information associated with the identification tag, or from the information associated with the identification tag, wherein the configuration data allow configuring the combinatorial processing system to identify locations of the multiple reactors.

11. A method as in claim 10, further comprising alerting a user when a user input does not match with the configuration data.

12. A method as in claim 1, further comprising tracking usages of the installed interchangeable reactor assembly.

13. A method as in claim 1, further comprising tracking performance of the installed interchangeable reactor assembly.

* * * * *